United States Patent
Klusáček et al.

(10) Patent No.: US 11,971,372 B2
(45) Date of Patent: Apr. 30, 2024

(54) METHOD OF EXAMINING A SAMPLE USING A CHARGED PARTICLE MICROSCOPE

(71) Applicant: FEI Company, Hillsboro, OR (US)

(72) Inventors: Jan Klusáček, Brno (CZ); Tomáš Tůma, Brno (CZ); Jiří Petřek, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/886,716

(22) Filed: May 28, 2020

(65) Prior Publication Data
US 2020/0393392 A1    Dec. 17, 2020

(30) Foreign Application Priority Data
May 29, 2019  (EP) .................................... 19177314

(51) Int. Cl.
| | |
|---|---|
| *G01N 23/2251* | (2018.01) |
| *G01N 23/2206* | (2018.01) |
| *G01N 23/2252* | (2018.01) |
| *G06V 10/762* | (2022.01) |
| *G06V 20/69* | (2022.01) |

(52) U.S. Cl.
CPC ..... *G01N 23/2251* (2013.01); *G01N 23/2206* (2013.01); *G01N 23/2252* (2013.01); *G06V 10/763* (2022.01); *G06V 20/69* (2022.01)

(58) Field of Classification Search
CPC .......... G01N 23/2206; G01N 23/2251; G01N 23/2252; H01J 37/222; H01J 37/28
See application file for complete search history.

(56) References Cited

U.S. PATENT DOCUMENTS

| | | | |
|---|---|---|---|
| 2011/0266440 A1 | 11/2011 | Boughorbel et al. | |
| 2013/0015351 A1* | 1/2013 | Kooijman | H01J 37/28 250/307 |
| 2016/0307729 A1 | 10/2016 | Lazic et al. | |

FOREIGN PATENT DOCUMENTS

JP          2002323463          11/2002

\* cited by examiner

*Primary Examiner* — David A Vanore (57) ABSTRACT

The invention relates to a method of examining a sample using a charged particle microscope, comprising the steps of providing a charged particle beam, as well as a sample; scanning said charged particle beam over said sample at a plurality of sample locations; and detecting, using a first detector, emissions of a first type from the sample in response to the beam scanned over the plurality of sample locations. Spectral information of detected emissions of the first type is used to assign a plurality of mutually different phases to said sample at said plurality of sample locations. Information relating to at least one previously assigned phase and its respective sample location is used for establishing an estimated phase for at least one other of the plurality of sample locations. Said estimated phase is assigned to said other sample location. A control unit is used to provide a data representation of said sample containing at least information on said plurality of sample locations and said phases.

11 Claims, 3 Drawing Sheets

METHOD OF EXAMINING A SAMPLE USING A CHARGED PARTICLE MICROSCOPE

The invention relates to a method of examining a sample using a charged particle microscope, comprising the steps of providing a charged particle beam, as well as a sample; scanning said charged particle beam over said sample at a plurality of sample locations; and detecting, using a first detector, emissions of a first type from the sample in response to the beam scanned over the plurality of sample locations.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically, in a SEM backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image merely provides information on the topology of the sample to be examined.

In a process called "energy dispersive x-ray spectroscopy" (also referred to as "EDS" or "EDX"), the energies of x-rays coming from the sample in response to the electron beam are measured and plotted in a histogram to form a material specific spectrum. The measured spectrum can be compared to known spectra of various elements to determine which elements and minerals are present in said sample.

One of the drawbacks of EDS is that it takes considerable time to accumulate an x-ray spectrum for the sample. Typically, a grid with discrete analysis points is used. The electron beam dwells on each analysis point while the EDS detectors record x-rays. Once sufficient x-ray counts are recorded the beam moves to the next analysis point. The signal from the EDS detectors is fed to a signal processing unit that builds an x-ray spectrum curve for each analysis point, which can be matched to an extensive library of known mineral phases to select the best match for that analysis point. This known method is relatively slow for determining the phases, i.e. chemical compositions, that are present in the sample.

With the above in mind, it is an object to provide an improved method of examining a sample using a charged particle microscope, wherein spectral information of detected emissions is used for examining said sample. In particular, it is an object of the present invention to provide a method and apparatus for more rapidly and/or more accurately acquiring information about a sample.

To this end, the invention provides a method of examining a sample using a charged particle microscope, as defined in claim 1. The method comprises the steps of: providing a charged particle beam, as well as a sample; scanning said charged particle beam over said sample at a plurality of sample locations; detecting, using a first detector, emissions of a first type from the sample in response to the beam scanned over the plurality of sample locations; assigning, using spectral information of detected emissions of the first type, a plurality of mutually different phases to said sample at said plurality of sample locations; and providing, by a control unit, a data representation of said sample containing at least information on said plurality of sample locations and said phases.

As defined herein, the method comprises the steps of: establishing, using information relating to at least one previously assigned phase and its respective sample location, an estimated phase for at least one other of the plurality of sample locations; and assigning said estimated phase to said other sample location.

As described above, the method comprises the step of detecting, using a first detector, emissions of a first type from the sample in response to the beam scanned over the area of the sample. The method furthermore comprises collecting spectral information of said detected emissions of said first type. The emissions detected by the first detector can be related to a specific scanning beam position, i.e. can be related to a specific position on the sample. This means that spectral information may be collected and/or determined for corresponding positions on the sample as well. The obtained spectral information for different positions, may be compared to each other, and one or more specific phases can be assigned to these different positions. Already assigned phases can be used to establish an estimated phase for other positions, for example based on proximity to these already assigned phases, based on a partially obtained spectral profile obtained for the other positions, or based on other parameters.

Hence, in the method as described herein, measured data of at least one sample location can be used to establish estimated data for at least one further sample location. In an embodiment, measured data of several sample locations may be used to establish estimated data for at least one further sample location. It is conceivable that estimated data for several further sample locations is established.

The measured data (i.e. assigned phases where use is made of spectral information of detected emissions of the first type) and estimated data (i.e. at least one estimated phase) can be combined. Said measured data and estimated data may then be combined into said data representation of said sample. With this it is possible to generate the data representation of the sample more quickly, in particular as the process of estimating phases based on readily established phases is relatively quick. Hence, it is possible to provide the user with information on the phases of the sample in less time. With this, the object as defined herein is achieved.

In particular, the method as defined herein allows an established phase, i.e. the chemical composition, of one (or more) sample location(s) to be used for assigning the phase, i.e. the chemical composition, of one (or more) further sample location(s). With this, a speed improvement is obtained.

This holds in particular true for EDS mapping, i.e. when the first detector is an EDS detector. The inventors found that during x-ray mapping, the EDS spectra from the total of N individual pixels are not fully independent. In the majority of EDS scenarios, it can be assumed that in the sample, there are several (K<<N) distinct chemical substances (also called "phases") each with its characteristic spectrum. Therefore, each spectrum from a given phase provides additional information about that phase and in turn about all pixels belonging to that phase. This extra information enables the prediction of dense spectra from sparse ones and therefore accelerate the whole of EDS x-ray mapping process.

Advantageous embodiments will be discussed below.

Said spectral information of detected emissions of the first type may, in an embodiment, be used for dividing at least a part of the scanned area of the sample into multiple segments. Emissions of the first type at different positions along the scan in at least one of said multiple segments can be combined to produce a combined spectrum of the sample in said one of said multiple segments. The use of multiple segments allows an improved estimated phase to be established, for example by using the proximity of the new location to previously determined locations falling within a specific segment. The use of a combined spectrum allows partial data of new locations to be compared to one or more previously obtained combined spectra, with which it will be easier to establish an estimated phase for that new location.

In an embodiment, a second detector is used for detecting emissions of a second type from the sample in response to said beam scanned over said area of said sample, and said emissions of said second type are at least partly used for establishing an estimated phase for at least one other of the plurality of sample locations. In this embodiment, an additional detector is used to detect emissions of a second type. These emissions of the second type are different from the emissions of the first type. The emissions of the second type can be used, directly or indirectly, in establishing an estimated phase for at least one other of the plurality of sample locations.

In an embodiment, said second detector is arranged for detecting charged particles, in particular electrons, such as backscattered electrons. The second detector may thus be a BSE detector. It is furthermore conceivable that said first detector is arranged for detecting particles, in particular photons, such as x-ray photons.

Backscattering of electrons depends on the atomic number of the elements in the surface and upon the geometric relationship between the surface, the primary beam, and the detector. The backscattered electron image therefore shows contour information, that is, boundaries between regions of different composition, and topographical information. Obtaining a backscattered electron image requires collecting only a sufficient number of electrons at each point to produce a reasonable contrast between points having different properties and so is much faster than obtaining a sufficient number of x-rays to compile a complete spectrum at each point. Also, the probability of an electron being backscattered is greater than the probability of the electron causing the emission of a characteristic x-ray of a particular frequency. Obtaining sufficient backscattered electron image data at a single dwell point typically takes less than a microsecond, whereas acquiring sufficient x-rays to obtain an analyzable spectrum at a single dwell point typically takes more than a millisecond.

In an embodiment, the emissions of the second type are used for defining multiple segments of the sample. In this embodiment, the method further comprises the steps of: detecting using a second detector emissions of a second type from the sample in response to said beam scanned over said area of said sample; and using emissions of the second type, dividing the scanned area of the sample into multiple segments.

The use of segments can be advantageous, as already described above.

In an embodiment, an image is first acquired using a backscattered electron detector, and the image is then processed to identify regions (or segments) that appear from the contrast to have the same elemental composition. The beam is then scanned over the sample, at least over one or more of the identified regions, and preferably multiple times, to collect an x-ray spectrum representative of the region. The identified regions and/or X-rays generated during the backscattered electron detector scan may advantageously be used to already obtain information that may be used for establishing estimated phases for other points.

In an embodiment, the beam may be used to scan the sample and collect spectral information for multiple analysis points at the same time. Rather than collecting complete spectral information for a distinct analysis point and then moving on to the next analysis point, the sample can be scanned in a continuous manner and data is obtained for all desired sample positions. The scanning of the beam is relatively fast and the beam may be continuously or semi-continuously scanned over the area of the sample to be examined. After one or more scans, the spectral information obtained may be sparse, i.e. meaning that some analysis points may indeed provide complete information, whilst other analysis points do not. This way, data obtained for some analysis points can be used to establish estimated data for other points.

The method may comprise the step of additionally scanning at least a part the area of the sample to be examined, and detecting using said first detector emissions of said first type in response to said additional scanning. By repeatedly scanning, in a continuous or semi-continuous way, more information relating to said first type emissions can be obtained, to further improve the acquired information and to improve the estimated phases.

In an embodiment, the method comprises the step of associating phases to measured and/or expected emissions of said first type.

It is conceivable that measured data of the at least one further sample location is used in establishing a phase for said further sample location. For example, it is possible that the measured data of said further sample location, i.e. the spectral information of detected emissions of the first type for that location, is still relatively sparse. In that case, the measured data can be compared to previously obtained data. Based on previously assigned phases, for example, it can then already be decided whether the further sample location comprises one or more known phases. In this case, the information relating to at least one previously assigned phase can be used to compare the data of the further sample location, and an estimated phase can be assigned to said other sample location.

In an embodiment said step of establishing comprises the use of a machine learning estimator. The machine learning estimator is able to predict the most likely dense spectra for individual sparse spectra at the input. The proposed machine learning estimator can maintain an inner model of phases and their spectra. With each incoming (sparse) spectrum, the model is updated and the spectrum can be evaluated to get similarity scores with the modelled phases. Finally, the spectra of the modelled phases can be combined according to these similarity scores to produce an estimation of the most likely dense spectrum given the input and the current state of the model.

It is conceivable that said machine learning estimator comprises one or more estimators chosen from the group comprising: Non-negative matrix factorization (NMF), Singular value decomposition (SVD), independent component analysis (ICA), latent Dirichlet allocation (LDA) and K-means. These are all unsupervised learning techniques capable of component/cluster identification and characterization.

In an embodiment, one or more estimated phases are provided in an incremental fashion. In other words, the method may comprise the step of establishing, using information relating to at least one previously assigned phase and its respective sample location, an improved estimated phase for at least one other of the plurality of sample locations.

In an embodiment, the machine learning estimator comprises an online learning functionality. This means that the machine learning estimator is capable of learning from new examples and improve upon further estimations. One way of achieving this is by means of a feedback loop, which can be provided by means of a full scan of the sample and establishing phases based on measured data. The measured data can be checked with the previously estimated data, and with this online learning of the machine learning estimator is possible. With this, a significant speed up is possible, in particular when the user generally researches similar samples.

The machine learning estimator may comprise one or more cues for initialization. In an embodiment, analysis of backscattered electrons is used. To this end, a second detector for detecting emissions of a second type is provided. The first detector could be an EDS detector in this embodiment, and said second detector is a BSE detector.

In an embodiment quantification of results of the integral spectrum is used as a cue for the machine learning estimator initialization. Other means of initialization are conceivable as well.

In an embodiment, a ratio between the number of measured sample locations and the number of estimated sample locations is in the range of 10:1 to 1:10, in particular wherein said ratio is in the range of 1:2 to 1:10. Experimental measurements confirmed that by using the proposed method, high quality estimates can be obtained from extremely sparse spectra. For example, estimates computed from spectra with only 15 counts were comparable to unprocessed spectra with 150 counts. This enables an order of magnitude increase in the EDS mapping speed, for example. This holds especially true in the early phases of data collection. Moreover, even for large datasets collected over longer acquisition periods, the quality of the EDS maps constructed by using the proposed estimator is significantly improved. This is because the regularization inherent in the estimator decreases the effect of the stochastic noise in the input data.

In this regard it is noted that it is possible, in an embodiment, that the sample locations comprise a first group of sample locations that each contain a substantially complete spectral profile, and a second group of sample locations that each contain a substantially incomplete spectral profile. With substantially incomplete spectral profile it is meant that no spectral data exists, or that the spectral data is sparse in a sense that no final conclusion on a particular phase can be made. The method may comprise the step of using sample locations from the first group of sample locations to estimate a phase for at least one of the sample locations from the second group of sample locations. The method may additionally or alternatively comprise the step of using partial data of at least one sample location of the second group of sample locations to estimate a phase for at least one of the sample locations from the second group. The step of estimating may comprise comparing the partial data of the second group to spectral data from the first group of sample locations. Comparing may be done by means of a machine learning estimator, as described herein. It is in particular this embodiment that allows the above described ratios to be achieved, and in particular this allows for rapid and accurate data acquisition. Said information relating to said at least one previously assigned phase at said respective sample location may comprise spectral information of detected emissions of the first type at said sample location.

According to an aspect, a charged particle microscope for examining a sample using the method according to one or more of the previous claims is provided. Said charged particle microscope comprises: an optics column, including a charged particle source, a final probe forming lens and a scanner, for focusing a beam of charged particles emitted from said charged particle source onto a specimen; a specimen stage positioned downstream of said final probe forming lens and arranged for holding said specimen; a first detector for detecting emissions of a first type originating from said specimen in response to the incidence of charged particles emitted from said charged particle source; a control unit and a processing device connected to said first detector. According to this aspect, said charged particle microscope is arranged for executing the method as defined herein. Advantages have been elucidated above already.

The invention will now be elucidated in more detail on the basis of exemplary embodiments and the accompanying schematic drawings, in which.

Figure 1:
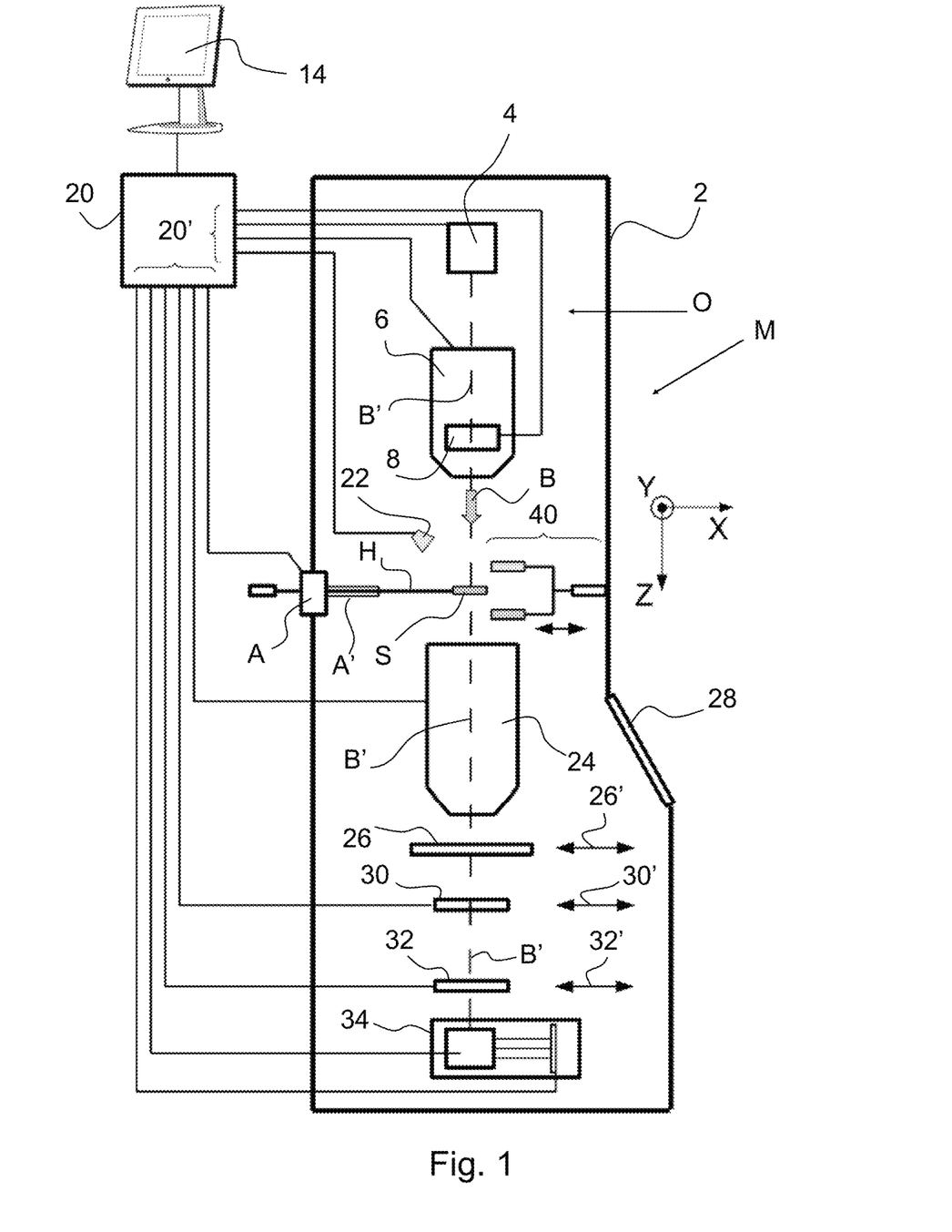
FIG. 1—shows a longitudinal cross-sectional view of a charged particle microscope according to a first embodiment of the invention.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as a TEM camera 30 and/or STEM camera 32.

At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M according to the invention, and of which an embodiment is shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is the analysis device 22, which—as mentioned before—might be a combined scintillator/photomultiplier or EDS (Energy-Dispersive X-Ray Spectroscopy) module. In a preferred embodiment, said first detector is an EDS. Furthermore, the apparatus according to the invention comprises the control unit (i.e. controller/processor) 20 that is connected (by means of lines 20') to said first detector 22 (schematically shown). According to the invention, said charged particle microscope M is arranged for executing the method according to the invention, which will be explained in more detail later.

Figure 2:
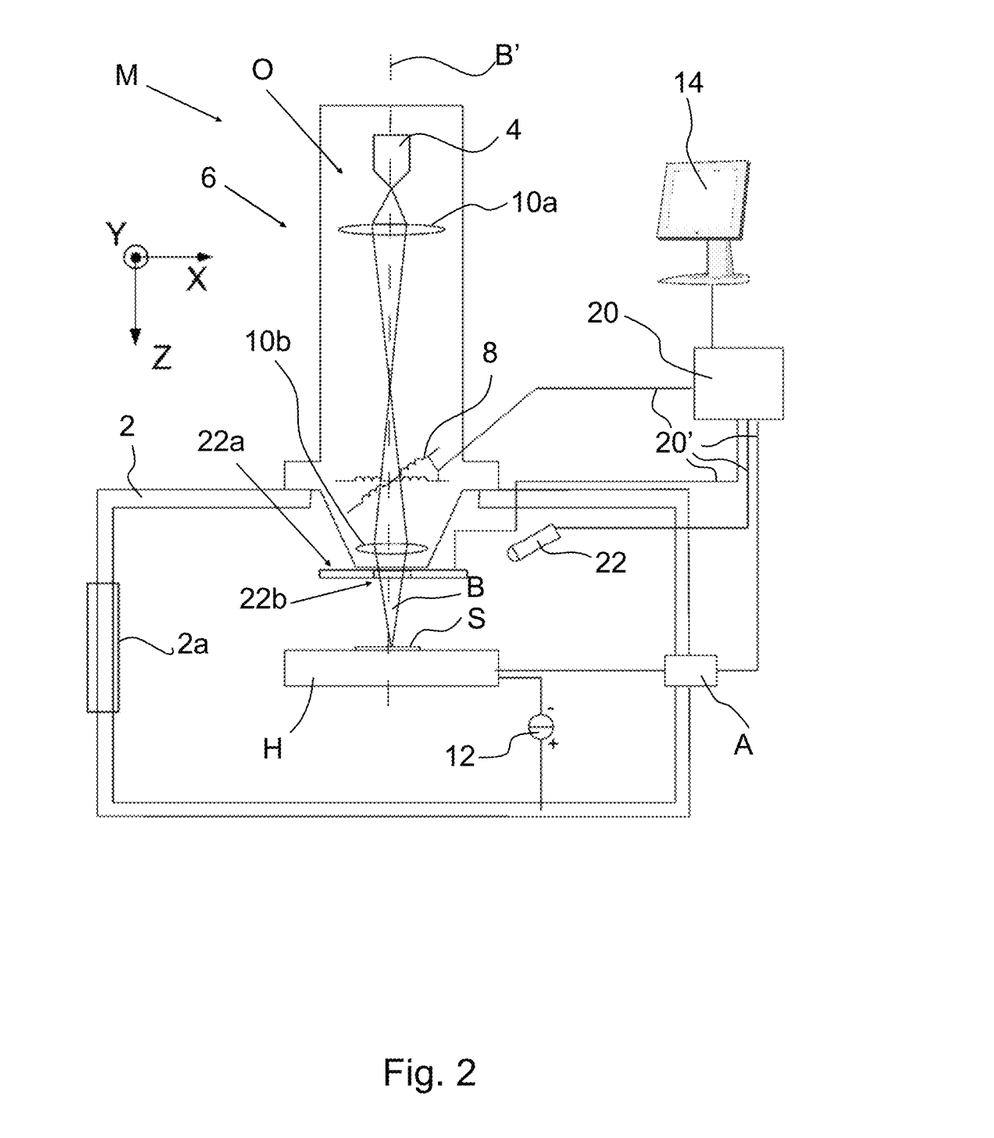
FIG. 2—shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts: 2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired; 10a, 10b: Schematically depicted lenses/optical elements in illuminator 6; 12: A voltage source, allowing the specimen holder H, or at least the specimen S, to be biased (floated) to an electrical potential with respect to ground, if desired; 14: A display, such as a FPD or CRT; 22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Thus the charged particle microscope M as shown in FIG. 2 comprises an optics column O, including a charged particle source 4, a final probe forming lens 6, 10a, 10b and a scanner 8, for focusing a beam B of charged particles emitted from said charged particle source 4 onto a specimen S. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is said analysis device 22, which—as mentioned before—might be a combined scintillator/photomultiplier or EDS (Energy-Dispersive X-Ray Spectroscopy) module. In an alternative embodiment, the first detector 22 may be the segmented detector 22a, 22b. In a preferred embodiment, said first detector is an EDS. Furthermore, the apparatus according to the invention comprises said control unit 20 that is connected (by means of lines 20') to said first detector 22.

Figure 3:
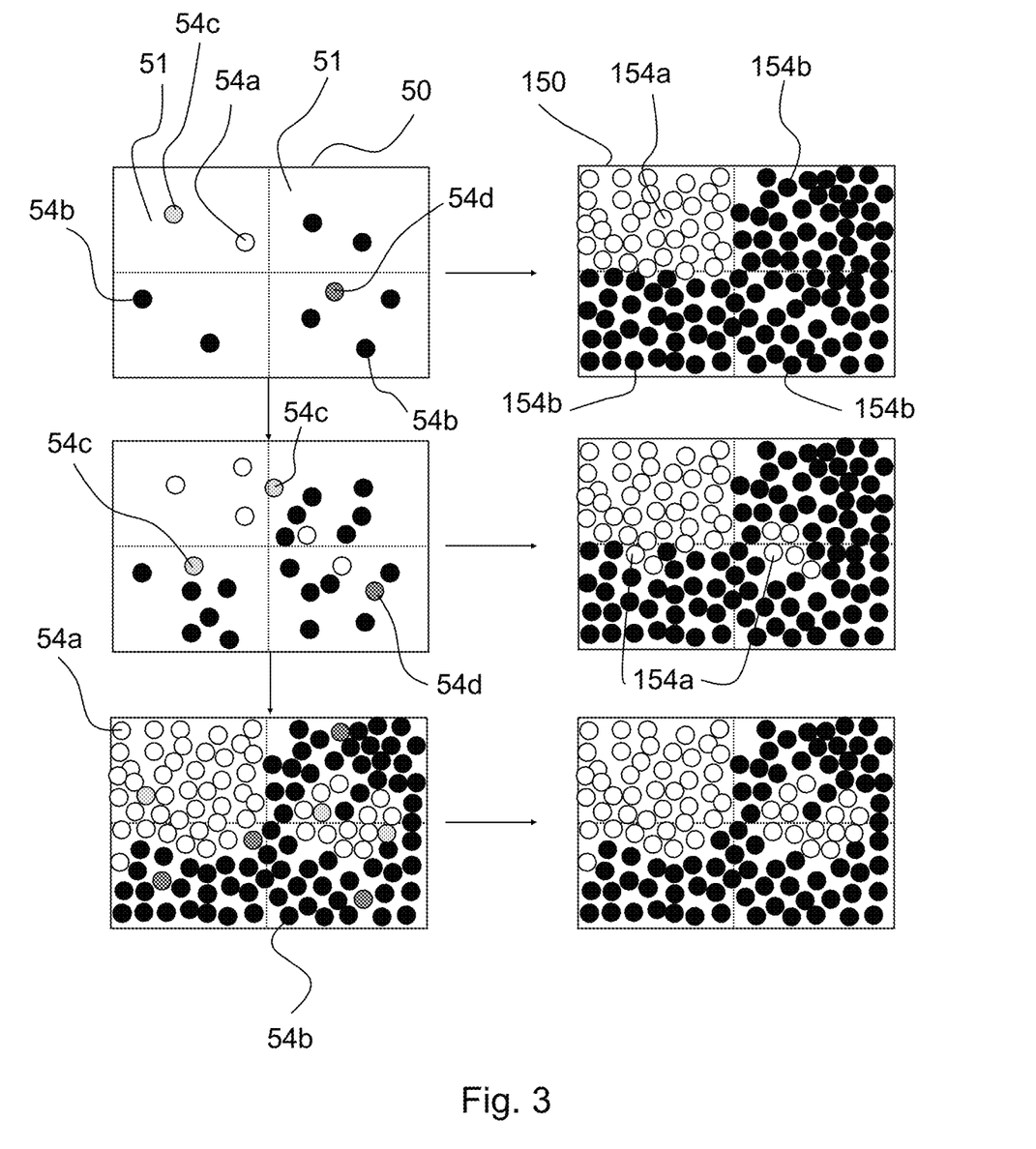
FIG. 3—show a schematic overview of an embodiment of the method according to the invention.

The apparatus shown in FIG. 1 and FIG. 2 may be used in examining a sample with a method according to the invention. Embodiments of the method according to the invention are shown in FIG. 3. In general, these methods all comprise the steps of: providing a charged particle beam B, as well as a sample S, and scanning said charged particle beam B over said sample at a plurality of sample locations; detecting, using a first detector 22, emissions of a first type from the sample in response to the beam B scanned over the plurality of sample locations; assigning, using spectral information G of detected emissions of the first type, a plurality of mutually different phases to said sample at said plurality of sample locations; and providing, by the control unit 20, a data representation of said sample S containing at least information on said plurality of sample locations and said phases.

According to the method as defined herein, the general method comprises the further steps of: establishing, using information relating to at least one previously assigned phase and its respective sample location, an estimated phase for at least one other of the plurality of sample locations; and assigning said estimated phase to said other sample location.

Now referring to FIG. 3, a first embodiment of the method according to the invention is schematically shown. FIG. 3 schematically shows, in the left hand side, an area 50 of a sample to be examined with acquired data 54a, 54b, and on the right hand side a representation 150 of the acquired data.

The area 50 of the sample is scanned with a beam of charged particles. The first detector, for example an EDS detector as described with reference to FIG. 1 and FIG. 2, is used to detect emissions of a first type from the sample in response to the beam scanned over the area 50 of the sample. These emissions are schematically indicated by data points 54a (white dots) and 54b (black dots) in FIG. 3. Data points 54a represent a different emission than data points 54b, i.e. meaning that the detector detects a different signal at these different locations. For example, this could be the result of the white points 54a representing a first material, and the black points 54b representing a second material (that is different from said first material). In this example, it is considered that the sample only contains these two materials, i.e. the sample only has the first material (white) and the second material (black). Also indicated are non-white and non-black points 54c, 54d that are representative for sample points that are undecisive yet, for example as they contain sparse spectral information. As indicated schematically in the top-left figure, point 54c seems to resemble the spectrum of the first material (54a), and point 54d seems to resemble the second material (54b). One skilled in the art will understand that the acquired data 54a, 54b can, in principle have many values (not only black or white), and that the representation values can be arbitrarily selected in dependence of the desired application. The example shown is merely an illustration of a single possibility and is not intended to be limited.

As shown in the sequence on the left-hand-side, from top to bottom, the data information 54a, 54b is relatively sparse in the beginning, and increases as scanning is continued. Some specific points are relatively sparse in terms of spectral information for that point and thus belong to an undecided material, i.e. neither black nor white (54c, 54d). In the top most step, the acquired data of the sample area 50 (left-hand side) is used to establish estimated phases 154a, 154b for the sample 150 (right-hand side). Use is made of spectral information of detected emissions 54a, 54b of the first type to establish the estimated phases of the plurality of sample locations. In the embodiment shown, the image representation 150 uses the measured points and the estimated points to represent the entire sample area 50 of the sample with data points. In other words, where no data exists, an estimated data point is used. Where inconclusive data is measured (points 54c, 54d), an estimated phase is taken in the image representation 150 as well, and hence phases are associated to the measured emissions of the first type. Where no data is present at all, the image representation has associated phases to expected emissions of the first type. It is noted that the obtained points and estimated points are shown in a scattered pattern, although a more regular, matrix-like pattern, is conceivable as well. In the embodiment shown, the data representation 150 (right-hand side) is an image representation, although any other representation, i.e. in data, is conceivable of course.

FIG. 3 shows (left-hand side, top to bottom) that scanning of the sample can continue, and that more data of the sample 50 is coming in. When more data comes in, this means that the image representation 150 (right-hand side) can be updated. Once again, sparse data points can be assigned a specific phase (either black or white, in the present case) based on measurement data that is already present. It is conceivable, in this regard, that neighboring sample points are compared to inconclusive sample points, and that based on the comparison a phase is assigned to the inconclusive sample point (54c, 54d). With increase of time, and hence incoming data, a more conclusive and reliable image representation 150 can be obtained.

It is conceivable that during data acquisition and/or processing, the scanned area 50 of the sample S is divided into multiple segments 51. As shown in FIG. 3, the scanned area 50 is divided into four regular, rectangular segments 51, although it will be understood by those skilled in the art that the number, shape, and regularity can be different. These segments can be used in establishing an estimated phase fore one or more of the pluralities of sample locations. In a particular advantageous embodiment, use is made of a second detector for establishing the segments. The second detector can be a BSE detector, as described earlier, and contours identified in the EM image can be used for segmentation. With this, it is possible to assign similar phases within a specific segment, or ensure that the estimated phase has a higher probability for a given phase that has been measured within a specific segment.

It is noted that a further division into further segments is conceivable as well. In particular, a further subdivision based on more incoming data points enables a more accurate image representation of the sample.

It is conceivable that the area 50 to be scanned is scanned multiple times to obtain the desired data quantity. Scanning multiple times may include scanning only a part of the area 50 of the sample. For example it is conceivable that, based on a first scan (or first set of scans), regions of interest and regions of non-interest are defined, and that only regions of interest are scanned in a second scan (or second set of scans). This increases the efficiency of the method. In particular, the regions of interest may be defined using the data obtained from the emissions of the second type, i.e. the EM data may be used to define regions of interest that are in particular scanned for obtaining EDS data.

It is advantageous to use a machine learning estimator for establishing estimated phases. Use of a machine learning estimator allows in particular a high ratio of measured sample locations to estimated sample locations to be obtained. As can be seen in the top right figure of FIG. 3, a ratio between the number of measured sample locations and the number of estimated sample locations is approximately 1:10, meaning that for every measured sample location it is possible to estimate a total of ten other locations. The ration can be in the range of 10:1 to 1:10, and more specifically in the range of 1:2 to 1:10. The machine learning estimator is able to predict the most likely dense spectra for individual sparse spectra at the input. The proposed machine learning estimator can maintain an inner model of phases and their spectra. With each incoming (sparse) spectrum, the model is updated and the spectrum can be evaluated to get similarity scores with the modelled phases. In other words, during data acquisition (top to bottom in FIG. 3), each newly acquired data point (left-hand side) gives information about the accuracy of the previously determined image representation (right-hand side). Hence, it is possible to update the machine learning estimator during use of the charged particle device, which makes the machine learning estimator very effective. As stated before, the machine learning estimator may comprise one or more estimators chosen from the group comprising: Non-negative matrix factorization (NMF), Singular value decomposition (SVD), independent component analysis (ICA), latent Dirichlet allocation (LDA) and K-means. These are all unsupervised learning techniques capable of component/cluster identification and characterization.

The method has been described above by means of several embodiments. The desired protection is conferred by the appended claims.

The invention claimed is:

1. A method of examining a sample using a charged particle microscope, comprising:
    providing a charged particle beam, as well as a sample;
    scanning said charged particle beam over said sample at a plurality of sample locations;
    detecting, using a first detector, emissions of a first type from the sample in response to the beam scanned over the plurality of sample locations;
    assigning, by a controller and using similarity scores with modelled phases generated based on spectral information of detected emissions of the first type:
        a plurality of mutually different phases to said sample at corresponding locations within the plurality of sample locations for which there is a substantially complete spectral profile; and
        an undecided phase to corresponding locations of at least one other of the plurality of sample locations for which the similarity score for the associated spectral data is not sufficient to assign a final conclusion on a particular phase;
    providing, by a control unit, a data representation of said sample containing at least information on said plurality of sample locations and said phases;
    establishing, using information relating to at least one previously assigned phase and its respective sample location, an estimated phase for said at least one other of the plurality of sample locations based at least in part on the spectral information for the at least one other of the plurality of sample locations; and
    assigning said estimated phase to said at least one other sample location.

2. A method according to claim 1, comprising the step of associating phases to measured and/or expected emissions of said first type.

3. A method according to claim 1, wherein a ratio between the number of measured sample locations and the number of estimated sample locations is in the range of 10:1 to 1:10.

4. A method according to claim 1, wherein said information relating to said at least one previously assigned phase at said respective sample location comprises spectral information of detected emissions of the first type at said sample location.

5. A method according to claim 1, wherein said first detector is an EDS detector.

6. A method according to claim 1, further comprising establishing, using information relating to at least one previously assigned phase and its respective sample location, an improved estimated phase for at least one other of the plurality of sample locations.

7. A method according to claim 1, wherein the scanning said charged particle beam over said sample at a plurality of sample locations is an initial scanning, and wherein establishing the estimated phase for said at least one other of the plurality of sample locations comprises providing estimated phases in an incremental fashion based on additional spectral information from at least one subsequent scan occurring after the initial scan.

8. A charged particle microscope for examining a sample, comprising:
    an optics column, including a charged particle source, a final probe forming lens and a scanner, for focusing a beam of charged particles emitted from said charged particle source onto a specimen;
    a specimen stage positioned downstream of said final probe forming lens and arranged for holding said specimen;

a first detector for detecting emissions of a first type originating from said specimen in response to the incidence of charged particles emitted from said charged particle source;

a control unit and a processing device connected to said first detector;

wherein said charged particle microscope is arranged for executing a method comprising the steps of:

scanning said beam of charged particles over said specimen at a plurality of specimen locations;

detecting, using the first detector, emissions of the first type from the sample in response to the beam of charged particles being scanned over the plurality of specimen locations;

assigning, using spectral information of detected emissions of the first type a plurality of mutually different phases to said specimen at corresponding locations within the plurality of specimen locations for which there is a substantially complete spectral profile; and an undecided phase to corresponding locations of at least one other of the plurality of sample locations for which one or more similarity scores for the associated spectral data is not sufficient to assign a final conclusion on a particular phase;

providing, by the control unit, a data representation of said specimen containing at least information on said plurality of sample locations and said phases;

establishing, using information relating to at least one previously assigned phase and its respective specimen location, an estimated phase for said at least one other of the plurality of specimen locations based at least in part on the spectral information for the at least one other of the plurality of sample locations; and assigning said estimated phase to said at least one other specimen location.

9. A charged particle microscope according to claim 8, wherein the charged particle microscope comprises a second detector for detecting emissions of a second type from the specimen in response to the beam scanned over the plurality of specimen locations.

10. A charged particle microscope according to claim 8, wherein a ratio between the number of measured specimen locations and the number of estimated specimen locations is in the range of 10:1 to 1:10, in particular wherein said ratio is in the range of 1:2 to 1:10.

11. A charged particle microscope according to claim 8, wherein said information relating to said at least one previously assigned phase at said respective specimen location comprises spectral information of detected emissions of the first type at said specimen location.

* * * * *